US009562667B2

(12) United States Patent
Kawamata et al.

(10) Patent No.: US 9,562,667 B2
(45) Date of Patent: Feb. 7, 2017

(54) WAVELENGTH CONVERTING DEVICE (71) Applicant: NICHIA CORPORATION, Anan-shi, Tokushima (JP)

(72) Inventors: Jun Kawamata, Tokushima (JP); Takao Kosugi, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/418,630

(22) PCT Filed: Jun. 24, 2013

(86) PCT No.: PCT/JP2013/067254
§ 371 (c)(1),
(2) Date: Jan. 30, 2015

(87) PCT Pub. No.: WO2014/021027
PCT Pub. Date: Feb. 6, 2014

(65) Prior Publication Data
US 2015/0316233 A1    Nov. 5, 2015

(30) Foreign Application Priority Data

Aug. 2, 2012   (JP) ................................ 2012-171706
Jun. 11, 2013  (JP) ................................ 2013-122877

(51) Int. Cl.
*F21V 9/16*    (2006.01)
*F21V 7/22*    (2006.01)
(Continued)

(52) U.S. Cl.
CPC . *F21V 9/16* (2013.01); *F21V 7/22* (2013.01); *F21V 29/502* (2015.01);
(Continued)

(58) Field of Classification Search
CPC ............ F21V 9/16; F21V 29/502; F21V 7/22; G03B 21/204; H01L 33/505; H01L 33/507; H01L 33/644
(Continued)

(56) References Cited

U.S. PATENT DOCUMENTS 7,473,933 B2 *   1/2009  Yan ..................... H01L 25/0753
                                              257/100
9,406,654 B2 *   8/2016  Yan ........................ H01L 33/64
(Continued)

FOREIGN PATENT DOCUMENTS

EP          2346100 A2   7/2011
EP          2421061 A1   2/2012
(Continued)

OTHER PUBLICATIONS

Extended European Search Report of the corresponding European Patent Application No. 13825031A , dated Feb. 29, 2016.

*Primary Examiner* — Dao H Nguyen
(74) *Attorney, Agent, or Firm* — Global IP Counselors, LLP (57) ABSTRACT (Problem to be Solved)
To provide a wavelength converting device which can efficiently exhaust heat from the wavelength converting member using a heat dissipating member.
(Solution)
The wavelength converting device includes a heat dissipating member, a wavelength converting member disposed on the heat dissipating member, and a connecting member which connects the heat dissipating member and the wavelength converting member. Particularly, the wavelength converting member includes an upper surface, side surfaces, and a lower surface, and the connecting member is thermally
(Continued)

connected to the side surfaces and the lower surface of the wavelength converting member.

5 Claims, 4 Drawing Sheets

(51) Int. Cl.
    *H01L 33/00*         (2010.01)
    *H01L 33/48*         (2010.01)
    *F21V 29/502*       (2015.01)
    *G03B 21/20*        (2006.01)
    *H01L 33/50*         (2010.01)
    *H01L 33/64*         (2010.01)

(52) U.S. Cl.
    CPC .......... *G03B 21/204* (2013.01); *H01L 33/505* (2013.01); *H01L 33/507* (2013.01); *H01L 33/644* (2013.01); *Y10T 29/49828* (2015.01)

(58) Field of Classification Search
    USPC .................. 257/76, 88, 91, 98, 99, E33.025, 257/E33.051, E33.056, E33.061, E33.067, 257/E33.075, E21.499; 313/501, 512; 353/31; 362/84, 317, 634; 438/26
    See application file for complete search history.

(56) References Cited

U.S. PATENT DOCUMENTS

| | | | |
|---|---|---|---|
| 2006/0054912 A1* | 3/2006 | Murakami | H01L 24/97 257/99 |
| 2009/0134421 A1* | 5/2009 | Negley | H01L 33/486 257/98 |
| 2009/0302345 A1* | 12/2009 | Chuang | H01L 33/641 257/99 |
| 2010/0123164 A1* | 5/2010 | Suehiro | F21V 5/043 257/99 |
| 2010/0187553 A1* | 7/2010 | Chen | H01L 33/60 257/98 |
| 2011/0175119 A1* | 7/2011 | Kim | H01L 33/483 257/91 |
| 2012/0037942 A1 | 2/2012 | Sanga | |
| 2012/0106126 A1 | 5/2012 | Nojima et al. | |
| 2012/0267997 A1* | 10/2012 | Kijima | C09K 11/661 313/498 |
| 2012/0292631 A1* | 11/2012 | Katsuno | H01L 33/62 257/76 |
| 2013/0037842 A1 | 2/2013 | Yamada et al. | |
| 2013/0056788 A1* | 3/2013 | Haraguchi | H01L 33/486 257/99 |
| 2014/0103383 A1 | 4/2014 | Sanga | |
| 2016/0027971 A1* | 1/2016 | Anc | C09K 11/025 257/98 |
| 2016/0035952 A1 | 2/2016 | Yamada et al. | |

FOREIGN PATENT DOCUMENTS

| | | |
|---|---|---|
| JP | 2009-267040 A | 11/2009 |
| JP | 2012-015001 A | 1/2012 |
| JP | 2012-098438 A | 5/2012 |
| JP | 2012-129151 A | 7/2012 |
| WO | 2011099384 A1 | 8/2011 |

* cited by examiner

WAVELENGTH CONVERTING DEVICE

BACKGROUND

1. Technical Field

Embodiments of the present invention relate to a wavelength converting device which can be used in a projector etc.

2. Background Art

Figure 2:
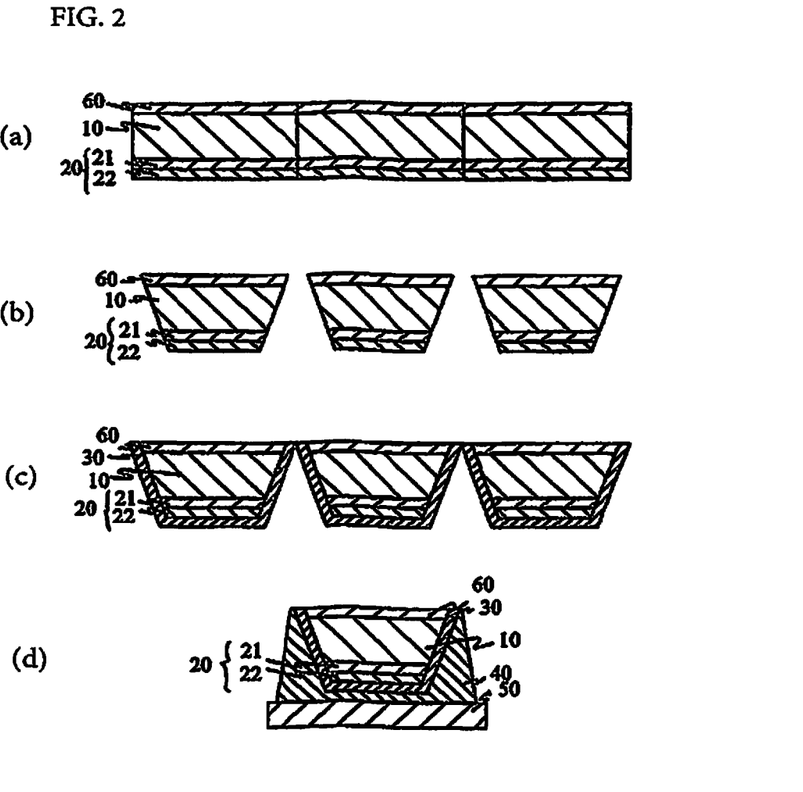
FIG. 2 is a schematic cross-sectional view illustrating a wavelength converting device according to a first embodiment.

The light source device described in Patent Literature 1 includes a solid light source which emits an excitation light, a fluorescent material layer which contains at least one type of fluorescent, and a heat dissipation substrate, in which the fluorescent material layer is joined to the heat dissipation substrate via a joining portion (for example, see FIG. 2). In this device, heat generated from the fluorescent material layer is dissipated to the heat dissipation substrate through the joining portion.

Patent Literature 1: JP 2012-15001A.

DISCLOSURE OF INVENTION

Problems Solved by the Invention

With regards to the light source device described in Patent Literature 1, the heat in the fluorescent material layer can be released only from the lower surface of the device, so that sufficient heat dissipation effects cannot be obtained. This may lead to a decrease in the wavelength conversion efficiency of the wavelength converting member, resulting in a failure to produce a desired optical output.

An aim of certain embodiments of the present disclosure is to provide a wavelength converting device that can efficiently dissipate heat so that degradation of the fluorescent material due to heat can be reduced.

Means to Solve the Problems

The wavelength converting device according to certain embodiments the present invention includes a heat dissipating member, a wavelength converting member disposed on the heat dissipating member, a connecting member which contains a metal material and connects the heat dissipating member and the wavelength converting member. In particular, the wavelength converting member may have an upper surface, side surfaces, and a lower surface, and the connecting member is thermally connected to the side surfaces and the lower surface of the wavelength converting member.

Effect of Certain Embodiments of the Invention

According to certain embodiments of the present invention, a wavelength converting device which can efficiently release heat from the wavelength converting member to the heat dissipating member can be obtained.

DETAILED DESCRIPTION OF THE EMBODIMENTS

Embodiments of the present invention will be described below with reference to the accompanying drawings. The embodiments shown below are intended as illustrative to give a concrete form to technical ideas of the present invention, and the scope of the invention is not limited to those described below. The sizes and the positional relationships of the members in each of the drawings are occasionally shown exaggerated for ease of explanation. Further, in the description below, the same designations or the same reference numerals denote the same or like members and duplicative descriptions will be appropriately omitted.

First Embodiment

Figure 1:
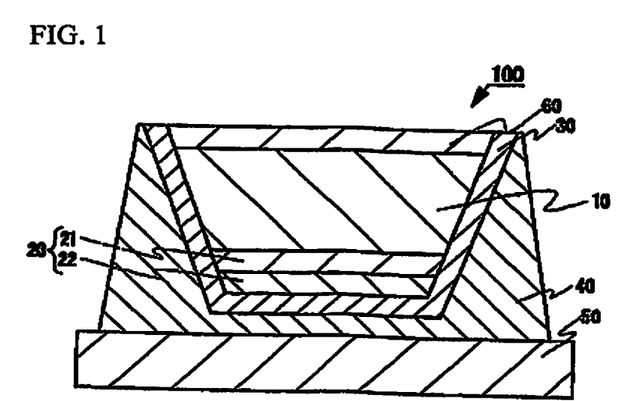
FIG. 1 is a schematic cross-sectional view illustrating a wavelength converting device according to a first embodiment.

FIG. 1 illustrates a wavelength converting device 100 according to the present embodiment. The wavelength converting device 100 includes a heat dissipating member 50, a wavelength converting member 10 disposed on the heat dissipating member 50, and a connecting member 4 which contains a metal material and connects the heat dissipating member 50 and the wavelength converting member 10. Particularly, the wavelength converting member 10 may include an upper surface, side surfaces, and a lower surface, and the connecting member 40 may be thermally connected to the side surfaces and the lower surface of the wavelength converting member 10.

With this arrangement, deterioration of the wavelength converting member 10 can be suppressed. This can be achieved because the connecting member 40 is thermally connected not only to the lower surface but also to the side surfaces, which allows an increase of the heat-dissipating paths.

Figure 3:
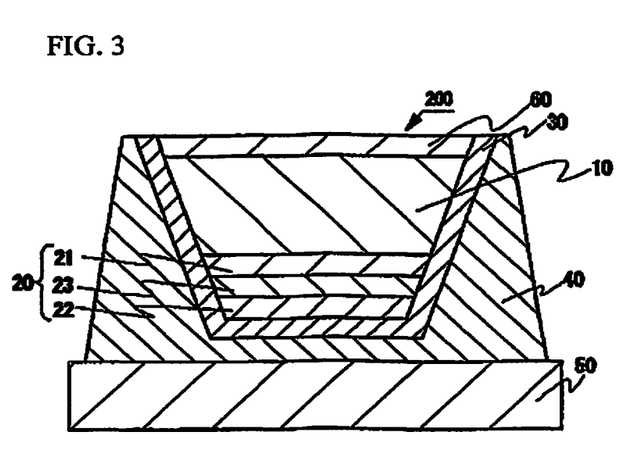
FIG. 3 is a schematic cross-sectional view illustrating a wavelength converting device according to a second embodiment.

For the sake of simplicity in explanation, in the present specification, the lower side in the cross-sectional views shown in FIG. 1 to FIG. 3 is described as "lower", and the upper side in the cross-sectional views shown in FIG. 1 to FIG. 3 is described as "upper". It is needless to say that those positional relationships are sufficient in relative magnitudes, and thus, for example, even if each figure is turned upside down, still falls within the scope of the present disclosure. In the present specification, the expression "thermally connected" refers not only those directly connected, but also those connected via a thermally conductive member.

The main components of the wavelength converting device 100 will be described below.

(Wavelength Converting Member 10)

The wavelength converting member 10 is configured to convert the wavelength of excitation light irradiated from the light source such as an LED, an LD, or the like. The wavelength converting member 10 can be formed, for example, by mixing fluorescent material powder and a holding body, and using a sintering method such as SPS (Spark Plasma Sintering), HIP (Hot Isostatic Pressing), CIP (Cold Isostatic Pressing). In the case of using an LD as a light source, because emission of an LD has a high optical density, the wavelength converting member 10 is likely to generate heat. However, a wavelength converting device with good heat dissipation performance can be sufficiently used even when an LD is used as its light source.

The wavelength converting member 10 preferably has a plate-like shape. With this arrangement, the wavelength converting member 10 can be disposed stably on the heat dissipating member 50. In the present embodiment, a fluorescent material which is excited by blue excitation light at a wavelength of 440 to 480 nm and emits green light at a wavelength of 500 to 540 nm. For the material of the wavelength converting member 10 which can satisfy the conditions shown above, a LAG-based fluorescent material, a YAG-based fluorescent material, or the like, can be used. For the holding body, aluminum oxide, magnesium oxide, zirconium oxide, lutetium oxide, titanium oxide, chromium oxide, tungsten oxide, divanadium pentoxide, molybdenum trioxide, sodium oxide, yttrium oxide, silicon dioxide, boron oxide, diphosphorus pentoxide, or the like, can be used.

The side surfaces of the wavelength converting member 10 can be formed so as to be inclined and expanded from the lower surface toward the upper surface. That is, the side surfaces of the wavelength converting member 10 respectively have a shape gradually expanding outward. At this time, the tilting angle (angle between the lower surface and each side surface) is preferably 5° or greater and 85° or less, more preferably 20° or greater and 70° or less, further preferably 30° or greater or 60° or less. With this arrangement, the surface area of the wavelength converting member 10 at the side surfaces can be increased, so that heat dissipation performance can be improved.

Further, although not shown in the figures, the side surfaces of the wavelength converting member 10 can be roughened. With this arrangement, light can be diffusely reflected, and can be extracted efficiently. Also, roughening increases the surface area of the side surfaces, so that heat dissipation performance can be further improved, and further, adhesion with the members such as the connecting member 40 and the intermediate layer 30 adhering to the side surfaces can be improved.

(Reflecting Layer 20)

In the present embodiment, the reflecting layer 20 is disposed between the wavelength converting member 10 and the connecting member 40. The reflecting layer 20 is to reflect light entering from the upper surface side of the wavelength converting member 10 again to the upper surface side. In the present embodiment, the reflecting layer 20 is disposed between the lower surface of the wavelength converting member 10 and the connecting member 40. Accordingly, light can be efficiently reflected, so that the light extracting efficiency can be improved. The reflecting layer 20 may be a single layer or a multilayer. In the present embodiment, a first reflecting layer 21 which is made of a dielectric material and a second reflecting layer 22 which is made of a metal material are disposed in this order as the reflecting layer 20, but either one of those can be used or a different structure can be employed for the reflecting layer 20. Next, a first reflecting layer 21 and a second reflecting layer 22 will be described.

(First Reflecting Layer 21)

The first reflecting layer 21 which is made of a dielectric material can be used. For example, silicon oxide, niobium oxide, aluminum oxide, zirconium oxide, aluminum nitride, silicon nitride etc., can be used for the first reflecting layer 21.

The first reflecting layer 21 may have a thickness of 10 nm or greater and 10000 nm or less, preferably 100 nm or greater and 1000 nm or less. With this arrangement, light incident with a shallow angle can be totally reflected.

The use of a dielectric material for the first reflecting layer 21 improves the reflectivity and the light extraction efficiency, but the thermal conductivity of dielectric is generally small, which may result in a decrease in the heat dissipation performance. On the contrary, according to the present invention, the connecting member 40 is connected not only to the lower surface but also to the side surfaces of the wavelength converting member 10, so that a decrease in the heat dissipation performance can be suppressed while maintaining high light extraction efficiency.

(Second Reflecting Layer 22)

The second reflecting layer 22 can be made of a metal material, and can be disposed under the first reflecting layer 21. For the second reflecting layer 22, for example, at least one metal selected from aluminum, silver, and rhodium can be included, of those, silver which has high reflectivity is preferably used. With this arrangement, light which cannot be reflected by the first reflecting layer 21 can be reflected by the second reflecting layer 22. Thus, light can be reflected without loss by the reflecting layer as a whole. In the case of using silver for the second reflecting layer, the reflecting layer is preferably formed only on the lower surface of the wavelength converting member. That is, the second reflecting layer is not formed on the side surfaces of the wavelength converting member. Forming the reflecting layer on the side surfaces of the wavelength converting member may result in partial exposure of the side surfaces, and sulfurization may occur from the exposed regions which results in blackening. Providing the reflecting layer only on the lower surface allows for a complete covering with an interposing layer, so that the second reflecting layer can be prevented from being exposed to the elements which may trigger deterioration. Accordingly, sulfurization can be suppressed.

Also, a diffusion-preventing layer can be formed on the lower surface of the reflecting layer 20. That is, the diffusion-preventing layer can be formed between the reflecting layer and an interposing layer. For the diffusion-preventing layer, for example, ruthenium, titanium/nickel/platinum, titanium/nickel/ruthenium, or the like, can be used.

(Interposing Layer 30)

An interposing layer 30 having a metal material and can be disposed on the side surfaces of the wavelength converting member 10 via connection with the lower surface of the reflecting layer 20. That is, the interposing layer 30 is preferably disposed to cover the exposed regions of the side surfaces of the wavelength converting member 10, the side surfaces of the reflecting layer 20, and the lower surface of the reflecting layer 20, and disposed between the wavelength converting member 10 and the connecting member 40. In the case of using an eutectic material for the connecting member 40, poor adhesion between the eutectic material and the wavelength converting member 10 may pose a problem with regards to the bondability. However, providing an interposing layer 30 can improve adhesion. Also, the reflecting layer 20 is covered, so that deterioration of the reflecting layer 20 can be suppressed.

As for the interposing layer 30, titanium/rhodium/gold, nickel/rhodium/gold, or the like, may be stacked adjacent the wavelength converting member 10 side. Accordingly, light passing through from the side surfaces can be reflected, so that the light extracting efficiency can be improved. The interposing layer 30 may have a thickness of 1 nm or greater and 10000 nm or less, preferably 100 nm or greater and 5000 nm or less.

When using silver for the second reflecting layer 22, sulfurization (discoloration to dark color) of the second reflecting layer 22 can result in significantly reduced reflectivity. However, according to the present embodiment, the second reflecting layer 22 is covered with the interposing layer 30, so that deterioration of the second reflecting layer 22 can also be suppressed.

(Connecting Member 40)

The connecting member 40 contains a metal material, and is for mechanically fixing the heat dissipating member 50 and the wavelength converting member 10 as well as simultaneously thermally connecting both. For the connecting member 40, a material which has good thermal conductivity is preferably used. For example, a conductive paste of silver, gold, palladium, or the like, a eutectic solder of gold-tin or the like, or a brazing material containing a metal having a low melting-point metal can be used. Of those, a eutectic solder of gold-tin which melts at a relatively low temperature and also has good heat releasing characteristic is preferably used.

The connecting member 40 is preferably thermally connected to all the regions except the upper surface of the wavelength converting member 10. That is, in the case where the reflecting layer 20 is not provided, the connecting member 40 is preferably thermally connected to the side surfaces and the lower surface of the wavelength converting member 10, and in the case where the reflecting layer 20 is provided under the wavelength converting member 10, the connecting member 40 is preferably connected to the side surfaces of the wavelength converting layer 10, the side surfaces of the reflecting layer 20, and the lower surface of the reflecting layer 20. Accordingly, heat dissipation path in a wide range can be secured. The connecting member 40 is not necessarily directly connected to the wavelength converting member 10, and for example, can be connected via the interposing layer 30.

(Heat Dissipating Member 50)

The heat dissipating member 50 is a so-called heat sink and thermally connected to the wavelength converting member 10 via the connecting member 40. The heat dissipating member 50 can be selected in view of thermal conductivity. Specific examples thereof include gold, silver, aluminum, nickel, copper, iron, tungsten, aluminum oxide, zirconium oxide, silicon nitride, aluminum nitride, diamond, stainless steel, brass, carbon black, preferably iron, and more preferably copper. With this arrangement, deterioration of the wavelength converting member 10 can be suppressed to provide a wavelength converting device which has high reliability.

The heat dissipating member 50 can typically be a plate-like shape. The heat dissipating member 50 may have its surface plated. Examples of the material for plating include nickel/gold. Accordingly, corrosion of the heat dissipating member 50 can be suppressed.

(Protective Layer 60)

A protective layer 60 made of silicon oxide or the like can be disposed on the upper surface of the wavelength converting member 10. With this arrangement, the wavelength converting member 10 can be prevented from being directly exposed, so that deterioration of the wavelength converting member 10 can be suppressed.

Method of Manufacturing a Wavelength Converting Device

A method of manufacturing wavelength converting device according to the present embodiment will be described below with reference to FIG. 2A to FIG. 2D.

(Providing a Wavelength Converting Member 10)

First, a fluorescent material and a holding material were mixed, and using a SPS method, a wavelength converting member 10 in a wafer state was provided. It is preferable that the upper surface and the lower surface of the wavelength converting member 10 are roughly polished by mechanical polishing, and then finely polished by using a CMP (Chemical Mechanical Polishing). With this arrangement, damaged portion due to the mechanical polishing can be removed, so that a wavelength converting member with a high luminous efficiency can be obtained.

(Formation of the Reflecting Layer 20)

Next, as shown in FIG. 2A, a protective layer 60 was formed on the upper surface of the wavelength converting member 10 in a wafer state, while a reflecting layer 20 was formed on the lower surface of the wavelength converting member 10. The reflecting layer 20 includes a first reflecting layer 21 and a second reflecting layer 22 in this order from the wavelength converting member 10 side.

(Singulation)

Next, as shown in FIG. 2B, the wavelength converting member 10 provided with the reflecting layer 20 and the protective layer 60 is singulated into a plurality of elements. At the time of singulation, a bevel cutting blade is used to form the side surfaces of the wavelength converting member so that it is inclined and expanded from the lower surface toward the upper surface.

(Formation of the Interposing Layer 30)

Next, as shown in FIG. 2C, an interposing layer 30 made of a metal material is disposed on each of the singulated elements. That is, the interposing layer 30 is disposed on the side surfaces of the wavelength converting member 10, side surfaces of the reflecting layer 20, and the lower surface of the reflecting layer 20. Examples of the method of forming the interposing layer 30 include a sputtering method, a vapor deposition method, a chemical vapor deposition (CVD) method, and an ion plating method. In the forming interposing layer, when the side surfaces of the wavelength converting member 10 are inclined and expanded from the lower surface toward the upper surface (i.e. bevel-cut), the interposing layer 30 can be formed with high precision on the entire region of the side surfaces of the wavelength converting member 10.

(Connection)

Next, as shown in FIG. 2D, the lower surface of the reflecting layer 20 and the heat dissipating member 50 are connected with a connecting member 40 which contains a metal material. For the method of connecting, a soldering method etc., can be employed. In the connecting, a phenomenon in which the connecting member 40 creeps up into the region where the interposing layer 30 is disposed. This is because the connecting member 40 which contains a metal is pulled by the interposing layer 30 made of a metal, due to surface tension. According to the method of manufacturing of the present embodiment, the interposing layer 30 is formed without exposing the side surfaces of the wavelength converting member, so that the connecting member 40 can cover the all exposed regions except for the upper surface of the wavelength converting member 10 with good accuracy.

Second Embodiment

As a different embodiment from that of the wavelength converting device 100, a structure as a wavelength converting device 200 shown in FIG. 3 can be employed. The wavelength converting device 200 has a third reflecting layer 23 made of a dielectric multilayer between the first reflecting layer 21 and the second reflecting layer 22 shown in the first embodiment. The third reflecting layer 23 can reflect light which is mainly perpendicularly incident to the first reflecting layer 21. In this configuration, due to the dielectric multilayer, the reflectivity can be improved while decreasing the heat dissipation performance. However, in certain embodiments of the present invention, the connecting member is disposed not only on the lower surface but also on the side surfaces, so that a certain degree of effects can be expected.

For the dielectric multilayer, among the materials for the dielectric layer in the first reflecting layer 21, two or more layers having different refractive index can be alternately stacked with predetermined thicknesses. For example, two or more pairs of silicon oxide/niobium oxide, silicon oxide/aluminum nitride, or the like, are preferably stacked.

EXAMPLE 1

With reference to FIG. 1, a wavelength converting device according to the present example will be described. First, a LAG-based fluorescent material in a powder form and a holding material made of alumina in a powder form were sintered by using a SPS method to obtain a wavelength converting member in a wafer state. A protective layer made of silicon oxide (100 nm in thickness) was disposed on the upper surface of the wavelength converting member in a wafer state by using a sputtering method, and a reflecting layer which has a first reflecting layer made of aluminum oxide (1000 nm in thickness) and a second reflecting layer made of silver (1000 nm in thickness) were disposed in this order from the wavelength converting member side on the lower surface of the wavelength converting member by using a sputtering method.

Next, using a bevel cutting blade, the side surfaces of the wavelength converting member were formed such that it is inclined and expanded from the lower surface toward the upper surface. At this time, the inclination angle (the angle between the lower surface and each side surface) was set to 45 degrees.

Next, an interposing layer made of titanium (10 nm in thickness)/rhodium (100 nm in thickness)/gold (100 nm in thickness) was disposed by using a sputtering method so as to integrally cover the side surfaces of the wavelength converting member, the side surfaces of the reflecting layer, the lower surface of the reflecting layer, and the side surfaces of the protective layer.

Next, the exposed surface of the interposing layer and the heat dissipating member made of nickel/gold-plated copper were connected through a gold-tin eutectic alloy by using a thermal compression method. As described above, the wavelength converting device according to the present example was fabricated.

COMPARATIVE EXAMPLE

As a comparative example, a wavelength converting device in which the interposing layer 30 and the connecting member 40 were provided only on the lower surface of the wavelength converting member 10, and the side surfaces of the wavelength converting member 10 are not inclined from the lower surfaces toward the upper surface, was compared with the wavelength converting device 100 shown in FIG. 1. In more detail, the wavelength converting device according to the comparative example has the upper surface with an equivalent planar dimension to that of the wavelength converting device according to Example 1, but the side surfaces are not inclined, so that the planar dimension of the lower surface differs from that of the wavelength converting device according to Example 1.

Figure 4:
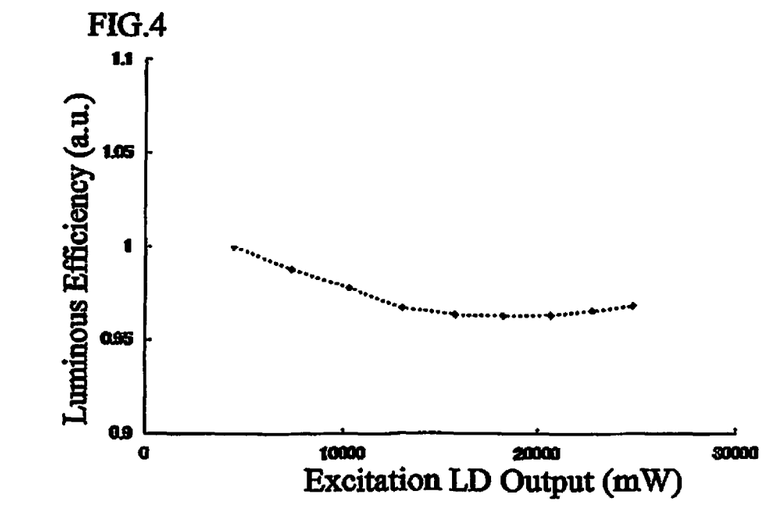
FIG. 4 is a graph showing the measurement results of the luminous efficiency of Example 1 and a Comparative Example.

FIG. 4 is a graph showing the measurement results of the luminous efficiency of Example 1 and the Comparative Example. The solid line represents Example 1 and the dashed line represents the Comparative Example. In FIG. 4, the ordinate represents a luminous efficiency and the abscissa represents an output power of excitation light. As seen from the figure, in the Comparative Example, the greater the output of excitation light, the lower the luminous efficiency results, but in Example 1, a small decrease in the luminous efficiency results even with a greater output of the excitation light (that is, Example 1 exhibits a superior luminous efficiency with respect to that of the Comparative Example). This result is considered to be because the heat dissipation in Example 1 is superior to that of the Comparative Example.

In the case of obtaining light of a certain brightness from the wavelength converting member, good luminous efficiency of the wavelength converting member allows a reduction of the power inputted into the light source. This allows not only for an extension of the lifetime of the light source but also allows for an reduction of heat generation in the wavelength converting member, so that the lifetime of the wavelength converting member itself can be extended. Also, generally, a coated lens is arranged between the light source and the wavelength converting device, in which, a reduction of the output of the light source allows for reducing the deterioration of the coating.

DENOTATION OF REFERENCE NUMERALS

100 wavelength converting device
10 wavelength converting member
20 reflecting layer
21 first reflecting layer
22 second reflecting layer
23 third reflecting layer
30 interposing layer
40 connecting member
50 heat dissipating member
60 protective layer

What is claimed is:
1. A wavelength converting device comprising:
a heat dissipating member;
a wavelength converting member disposed on the heat dissipating member; and
a connecting member containing a metal material and connecting the heat dissipating member and the wavelength converting member,
wherein the wavelength converting member includes an upper surface, side surfaces, and a lower surface,
the connecting member is thermally connected to the side surfaces and the lower surface of the wavelength converting member, and
no light emitting element is disposed between the wavelength converting member and the heat dissipating member.
2. A wavelength converting device comprising:
a heat dissipating member;
a wavelength converting member disposed on the heat dissipating member;
a reflecting layer;
an interposing layer made of a metal material; and
a connecting member containing a metal material and connecting the heat dissipating member and the wavelength converting member,
wherein the wavelength converting member includes an upper surface, side surfaces, and a lower surface,
the reflecting layer, the interposing layer and the connecting member are disposed between the lower surface of the wavelength converting member and the heat dissipating member such that the reflecting layer is disposed between the lower surface of the wavelength converting member and the interposing layer, and the inter- posing layer is disposed between the reflecting layer and the connecting member, and the connecting member is thermally connected to the side surfaces and the lower surface of the wavelength converting member.

3. The wavelength converting device according to claim 2, wherein the interposing layer is disposed in an entire region between the wavelength converting member and the connecting member.

4. The wavelength converting device according to claim 2, wherein the reflecting layer is formed only on the lower surface of the wavelength converting member.

5. The wavelength converting device according to claim 4, wherein the connecting member is composed of at least one of the following: a conductive paste of silver, gold, or palladium, a eutectic solder of gold-tin, or a brazing material containing a metal having a low melting-point.

* * * * *